United States Patent
Pisek et al.

(10) Patent No.: US 7,627,802 B2
(45) Date of Patent: Dec. 1, 2009

(54) EFFICIENT PARALLEL CYCLIC REDUNDANCY CHECK CALCULATION USING MODULO-2 MULTIPLICATIONS

(75) Inventors: Eran Pisek, Plano, TX (US); Jasmin Oz, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 711 days.

(21) Appl. No.: 11/504,158

(22) Filed: Aug. 15, 2006

(65) Prior Publication Data

US 2008/0065958 A1    Mar. 13, 2008

(51) Int. Cl.
  *H03M 13/00*   (2006.01)
  *G06F 11/00*   (2006.01)
(52) U.S. Cl. ........................ 714/758; 708/507
(58) Field of Classification Search ................ 714/758; 708/492, 507
See application file for complete search history.

(56) References Cited

U.S. PATENT DOCUMENTS

| | | | | |
|---|---|---|---|---|
| 5,619,516 A | * | 4/1997 | Li et al. | 714/807 |
| 6,029,186 A | * | 2/2000 | DesJardins et al. | 708/492 |
| 6,904,558 B2 | * | 6/2005 | Cavanna et al. | 714/781 |

* cited by examiner

*Primary Examiner*—Shelly A Chase

(57) ABSTRACT

A system and method for cyclic redundancy checks (CRC) having a CRC polynomial of width (W) for use in a digital signal processing system is disclosed. The system includes receiving a message ($\vec{m}$) and decomposing that message ($\vec{m}$) into a series of smaller blocks ($\vec{b}_i$). Each block ($\vec{b}_i$) is of size (M) and is related to a unit vector ($\vec{e}_i$). A summation operation on the blocks ($\vec{b}_i$) given by $CRC(\vec{b}) = \Sigma b_i \cdot CRC(\vec{e}_i)$ is performed. Each CRC of the unit vectors ($CRC(\vec{e}_i)$) is stored in a lookup table. The lookup table is tagged by the "one" bits of the message block. An exclusive OR (XOR) operation is performed on each tagged row of the lookup table to calculate the CRC of the message.

25 Claims, 5 Drawing Sheets

EFFICIENT PARALLEL CYCLIC REDUNDANCY CHECK CALCULATION USING MODULO-2 MULTIPLICATIONS

TECHNICAL FIELD OF THE INVENTION

The present invention relates generally to data processing systems and, more specifically, to constructs and methods for optimizing efficiency and capacity of cyclic redundancy check operations.

BACKGROUND OF THE INVENTION

In current systems, parallel cyclic redundancy check (CRC) computations involve decomposing an N-bit message into small blocks. Each block has a fixed size (M). The fixed size typically equals the polynomial degree. Most approaches include computing the CRC of a message and performing a series of N/M Galois multiply-accumulate operations. Each of the N/M blocks is multiplied by a pre-stored coefficient, divided by the CRC polynomial, and added to the accumulator. Accordingly, these systems require N/M Galois parallel multiply-accumulate operations.

There are a number of disadvantages to such approaches. For example, Galois multipliers typically require the use of special hardware with a considerable number of logical gates. Conventional Galois multiplier architectures consume large areas of silicon. Moreover, Galois operations are rarely used in common applications. Furthermore, the CRC polynomial is typically hardwired into an efficient Galois multiplier. Such a design is not reconfigurable to support other polynomials.

There is therefore a need for a system and method that provides a parallel algorithm that uses a mathematical operation, which requires no special logic and is configurable to any polynomial.

SUMMARY OF THE INVENTION

Embodiments of the present disclosure include a cyclic redundancy check (CRC) system for CRC calculations of small message blocks via a lookup table-based parallel algorithm.

In one embodiment, a method for cyclic redundancy checks (CRC) having a CRC polynomial of width (W) is disclosed. The method includes receiving a message ($\vec{m}$). The method also includes decomposing the message ($\vec{m}$) into a series of smaller blocks ($\vec{b}_i$) of size (M) and unit vectors ($\vec{e}_i$). The method further includes performing a summation operation on the blocks ($\vec{b}_i$) given by $$CRC(\vec{b}) = \sum b_i \cdot CRC(\vec{e}_i),$$

wherein the CRC of the unit vectors ($CRC(\vec{e}_i)$) is stored in a lookup table.

In another embodiment, a system for cyclic redundancy checks (CRC) having a CRC polynomial of width (W) is disclosed. The system includes a controller capable of receiving a message ($\vec{m}$) and decomposing the message ($\vec{m}$) into a series of smaller blocks ($\vec{b}_i$) of size (M) and unit vectors ($\vec{e}_i$). The controller is further capable of performing a summation operation on the blocks ($\vec{b}_i$) given by $$CRC(\vec{b}) = \sum b_i \cdot CRC(\vec{e}_i),$$

wherein the CRC of the unit vectors ($CRC(\vec{e}_i)$) is stored in a lookup table.

In still another embodiment, a process for cyclic redundancy checks (CRC) for use in a signal processing system is disclosed. The process includes decomposing a message ($\vec{m}$) into a series of smaller blocks ($\vec{b}_i$) of size (M) and unit vectors ($\vec{e}_i$). The process also includes performing a summation operation on the blocks ($\vec{b}_i$), wherein the operation is given by $$CRC(\vec{b}) = \sum b_i \cdot CRC(\vec{e}_i).$$

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "element", "construct" or "component" may mean any device, system or part thereof that performs a processing, control or communication operation; and such a device may be implemented in hardware, firmware or software, or some combination of at least two of the same. It should be noted that the functionality associated with any particular construct or component may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only, and should not be construed in any way to limit the scope of the disclosure. Hereinafter, certain aspects of the present disclosure are described in relation to illustrative embodiments and operations of wireless communications systems and networks. Those skilled in the art, however, will understand that the principles and teachings of the present disclosure may be implemented in a variety of suitably arranged signal processing systems utilized in any number of end-equipment applications.

Figure 1:
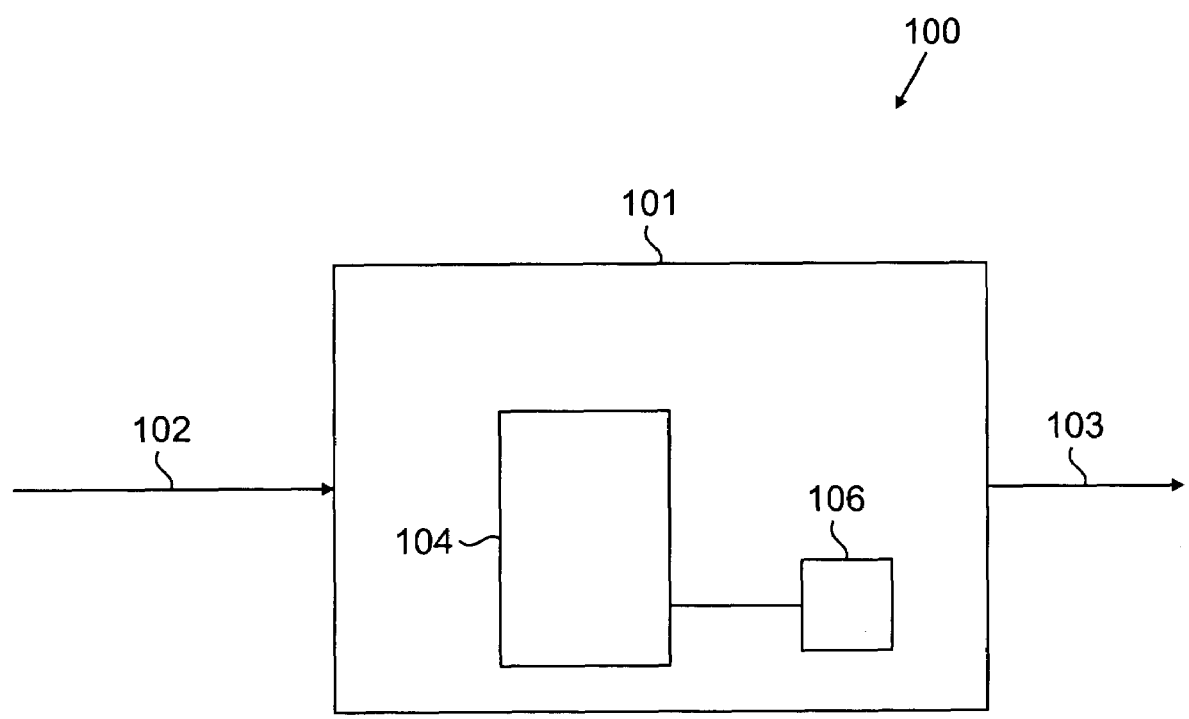
FIG. 1 illustrates a simplified block diagram of an exemplary digital signal processing system and controller for cyclic redundancy check (CRC) calculations according to one embodiment of the present disclosure.

FIG. 1 a simplified block diagram of a system 100 for cyclic redundancy check calculations in accordance with one embodiment of the present disclosure. System 100 includes a digital signal processing system 101 having an input 102 and an output 103. By way of example, system 100 may include wire line or wireless communication devices (including cell phones, PCS handsets, personal digital assistant (PDA) handsets, portable computers, telemetry devices, etc.), computer systems, audio and video equipment, satellite communications, multimedia applications, home automation systems and any other systems requiring digital signal processing. Digital signal processing system 101 includes a controller 104 for performing cyclic redundancy check calculations according to one embodiment of the present disclosure. Digital signal processing system 101 includes a lookup table 106. It should be understood that embodiments of the present disclosure may implemented into existing equipment, such as multipliers.

Typical Galois multiply-accumulate systems include a message ($\vec{m}$) consisting of N bits. The message is a superposition of a plurality of blocks ($\vec{b}_i$). Each block ($\vec{b}_i$) is of a fixed size (e.g., M bits). The blocks are multiplied over a Galois Field of prime two (e.g., GF(2)) with unit vectors ($\vec{e}_i$) shifted by M bits with respect to each other. Thus, the message ($\vec{m}$) can be decomposed as shown by Equation 1 below.

$$\vec{m} = \sum_{i=0}^{N/M-1} \vec{b}_i \otimes \vec{e}_i \qquad [\text{Eqn. 1}]$$

The summation and the multiplication operations included in Equation 1 are performed over GF(2). The GF(2) multiplication is shown as the symbol $\otimes$ while the GF(2) addition operation (an XOR operation) is shown as the symbol "$\oplus$".

As an example of a typical application for Galois multiply-accumulate system, suppose a message ($\vec{m}$) containing sixteen bits (N=16) required decomposition and is equal to the binary sequence [1101111100111010]. Suppose further that message ($\vec{m}$) is a superposition of blocks ($\vec{b}_i$) of a fixed number of bits (M). For example, suppose M=4 and the polynomial degree (or CRC width) W=3. Finally, suppose that the CRC polynomial ($\vec{p}$) is equal to [1010].

In typical Galois applications, message ($\vec{m}$) is first divided into four blocks [$\vec{b}_0$ $\vec{b}_1$ $\vec{b}_2$ $\vec{b}_3$] of four bits each, where $\vec{b}_0$=1010, $\vec{b}_1$=0011, $\vec{b}_2$=1111 and $\vec{b}_3$=1101. Moreover, message ($\vec{m}$) is the superposition of the blocks ($\vec{b}_i$) multiplied by unit vectors ($\vec{e}_i$) as given by Equation 2 below.

$$\vec{m} = \vec{b}_0 \otimes \vec{e}_0 \oplus \vec{b}_1 \otimes \vec{e}_1 \oplus \vec{b}_2 \otimes \vec{e}_2 \oplus \vec{b}_3 \otimes \vec{e}_3 \qquad [\text{Eqn. 2}]$$

Continuing with the example above, suppose that the unit vectors ($\vec{e}_i$) are given by $\vec{e}_0$=1, $\vec{e}_1$=10000, $\vec{e}_2$=100000000 and $\vec{e}_3$=1000000000000. Next, the CRC of the message ($\vec{m}$) is given by the modulo-2 division of message ($\vec{m}$) by the CRC polynomial ($\vec{p}$) as seen in Equation 3 below.

$$CRC(\vec{m}) = CRC\left(\sum_i \vec{b}_i \otimes \vec{e}_i\right) \qquad [\text{Eqn. 3}]$$
$$= \sum_i CRC(\vec{b}_i \otimes (\vec{e}_i))$$
$$= CRC\left(\sum_i CRC(\vec{b}_i) \otimes CRC(\vec{e}_i)\right)$$

Using the modulation properties of Equations 4 and 5 below and after assuming that x smaller than p (i.e., $\text{mod}(x)_p$=x), Equation 3 may be simplified to Equation 6 below, where $\vec{\beta}_i \equiv CRC(\vec{e}_i)$ and $\vec{\beta}_i$ is a set of pre-computed coefficients:

$$\text{mod}(x \oplus y)_p = \text{mod}(x)_p \oplus \text{mod}(y)_p \qquad [\text{Eqn. 4}]$$
$$\text{mod}(x \otimes y)_p = \text{mod}(\text{mod}(x)_p \otimes \text{mod}(y)_p)_p \qquad [\text{Eqn. 5}]$$
$$CRC(\vec{m}) \equiv \sum_i CRC(\vec{b}_i \otimes \vec{\beta}_i) \qquad [\text{Eqn. 6}]$$

Expanding the summation in Equation 6 for a polynomial degree of W=3, Equation 7 results.

$$CRC(\vec{m})=CRC(CRC(\vec{b}_0)\otimes\beta_0\oplus CRC(\vec{b}_1)\otimes\beta_1\beta CRC(\vec{b}_2)\otimes\beta_2\oplus CRC(\vec{b}_3)\otimes\beta_3) \qquad [\text{Eqn. 7}]$$

Using the unit vectors ($\vec{e}_i$) defined earlier, the set of pre-computed coefficients ($\vec{\beta}_i$) may be derived as: $\vec{\beta}_i$=CRC(1)=001, $\vec{\beta}_i$=CRC(10000)=100, $\vec{\beta}_2$=CRC(100000000)=100 and $\vec{\beta}_3$=CRC(1000000000000)=100. In addition, the CRCs of each of the message blocks ($\vec{b}_i$) yield: CRC($\vec{b}_i$)=000, CRC($\vec{b}_1$)=011, CRC($\vec{b}_2$)=101 and CRC($\vec{b}_3$)=111. Finally, the sum of the two GF(2) products is given by Equation 8.

$$CRC(\vec{b}_0) \otimes \vec{\beta}_0 = 00000 \qquad [\text{Eqn. 8}]$$
$$CRC(\vec{b}_1) \otimes \vec{\beta}_1 = 01100$$
$$CRC(\vec{b}_2) \otimes \vec{\beta}_2 = 10100$$
$$CRC(\vec{b}_3) \otimes \vec{\beta}_3 = 11100$$
$$\sum = 00100$$

Equation 8 yields the CRC of the message or CRC(00100)=100. Thus, according to one embodiment of the present disclosure a large message of size N may be parsed into a series of smaller blocks ($\vec{b}_i$) of size M and used to calculate the CRC of the message as given by Equation 3.

According to one embodiment of the present disclosure, to calculate the CRC of the message blocks (rather than the entire message), the blocks ($\vec{b}_i$) are decomposed into M base vectors as given by Equation 9.

$$\vec{b} = \sum_{i=0}^{M-1} b_i \cdot \vec{e}_i \qquad \text{[Eqn. 9]}$$

It is noted that Equation 9 is a special case of Equation 1, where N=M and M=1 (i.e., blocks ($\vec{b}_i$) are the block bits of message ($\vec{m}$)). Equation 9 also assumes that base vectors $\vec{e}_i$ are shifted copies of each other and that $\vec{b}_{M-1}$=1000 . . . 0. Finally, in accordance with one embodiment of the present disclosure, the summation over GF(2) of the CRCs of the unit vectors are multiplied by their respective coefficients as given by Equation 10.

$$CRC(\vec{b}) = \sum b_i \cdot CRC(\vec{e}_i) \qquad \text{[Eqn. 10]}$$

Figure 2:
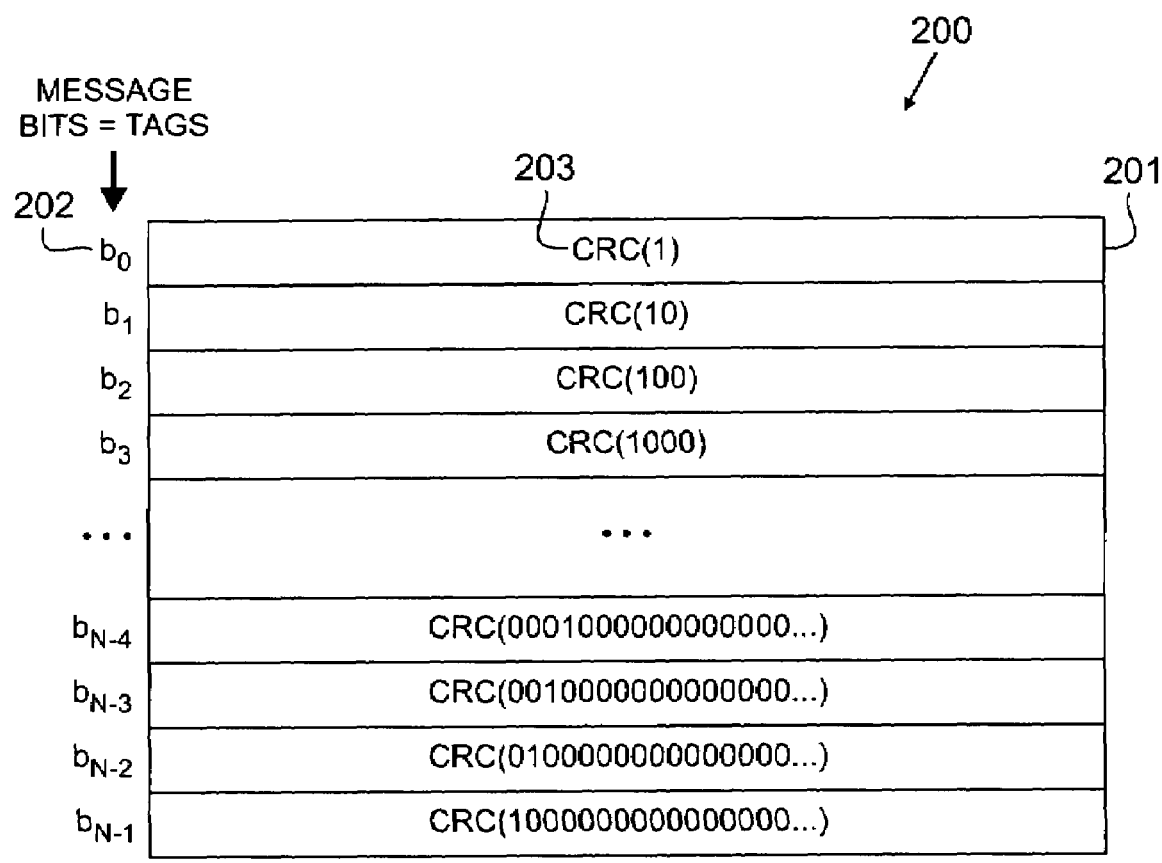
FIG. 2 illustrates a lookup table for CRC calculations according to one embodiment of the present disclosure.
Figure 3:
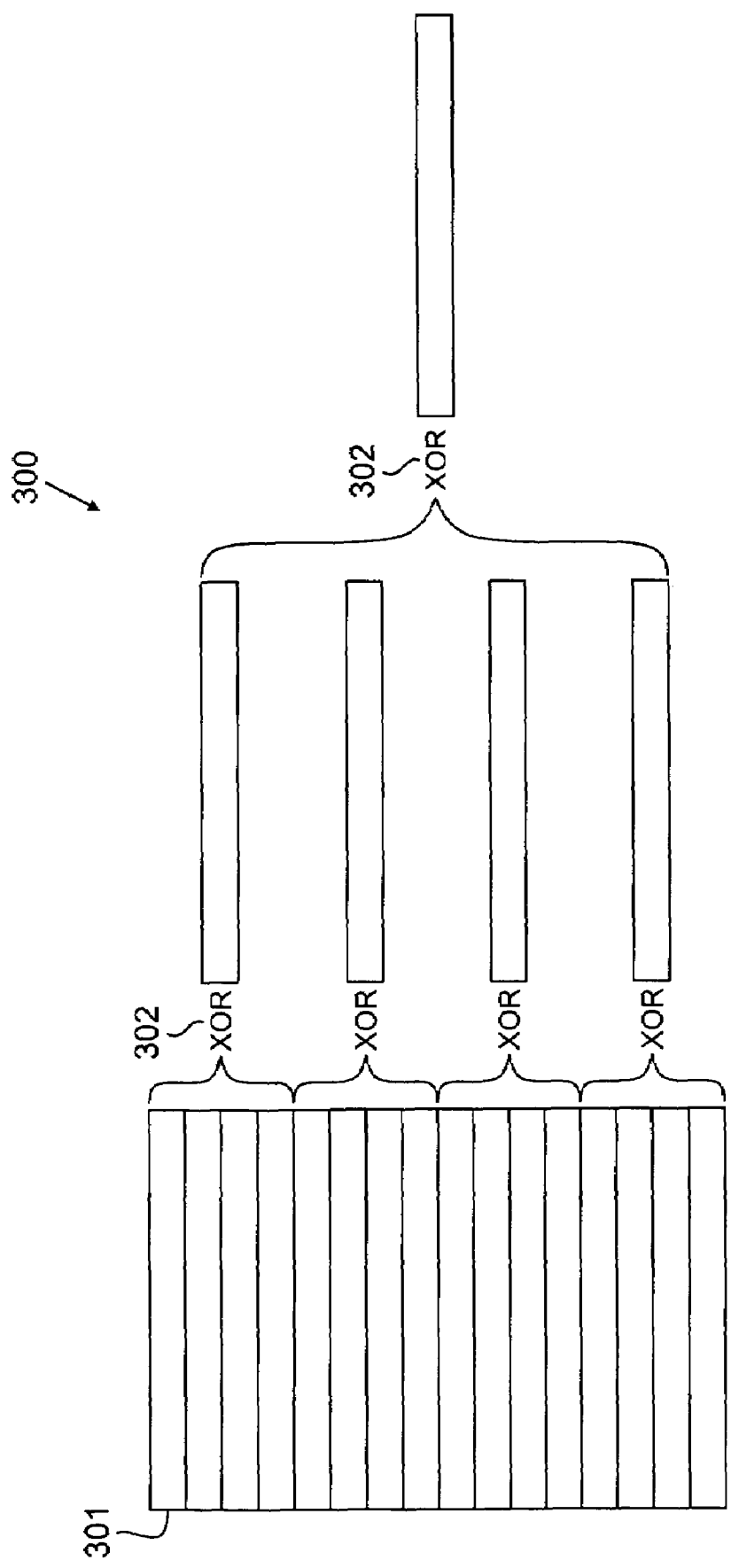
FIG. 3 illustrates a tree-wise summation of table entries according to one embodiment of the present disclosure.

FIG. 2 is an exemplary lookup table 200 with rows 201. Lookup table 200 stores the values of the CRC of the unit vectors (CRC($\vec{e}_i$)) 202. Lookup table 200 is preferably an M×W matrix, where W is the width of the CRC polynomial. Bits 202 of message block ($\vec{b}_i$) 202 act as tags for lookup table 200. In some embodiments, method 300 may be accomplished in a tree-wise fashion as shown in FIG. 3. In accordance with one embodiment of the present disclosure, XOR operations 302 between the selected table rows 301 may be performed in a fully parallel fashion or in gradual steps. However, it should be understood that XOR operations 302 may be executed by any suitable means.

Figure 4:
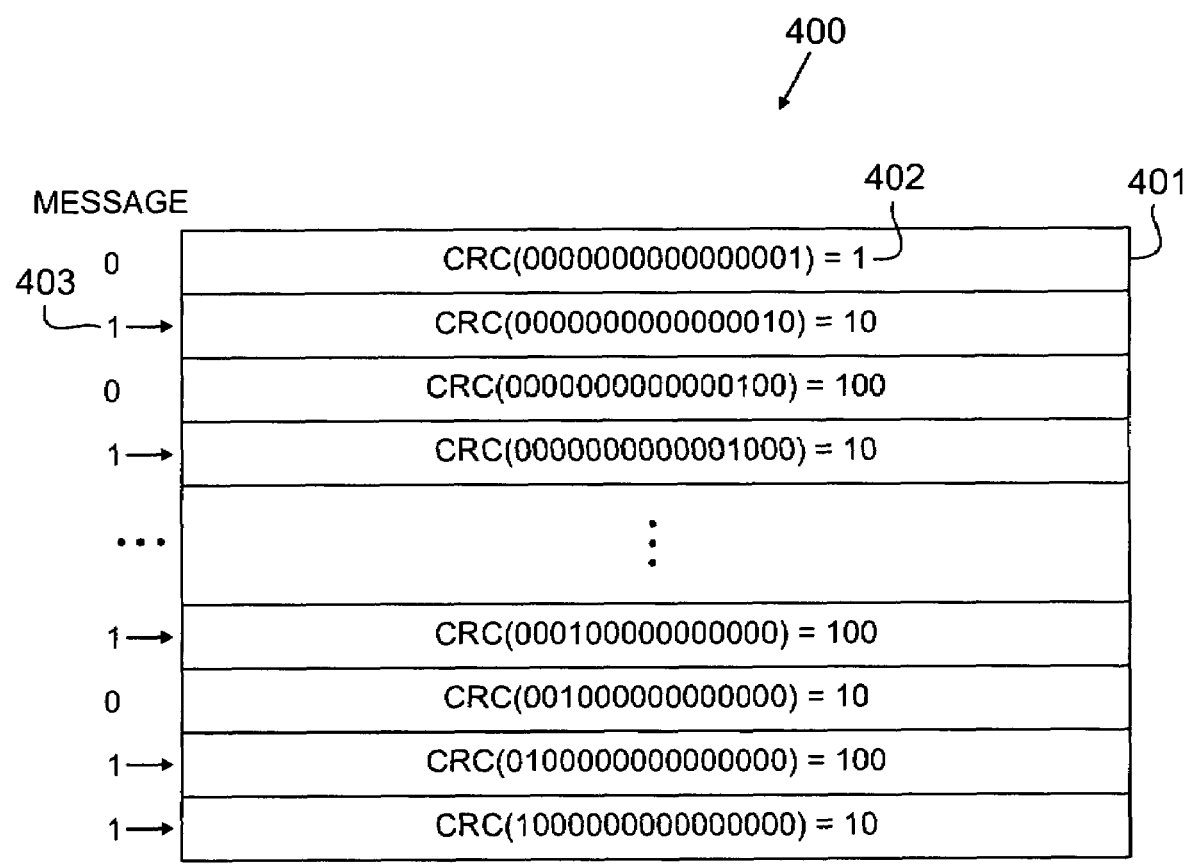
FIG. 4 illustrates a lookup table and tags for CRC calculation according to one embodiment of the present disclosure.

Referring now to FIG. 4, table 400 includes multiple rows 401. Each row 401 is populated with pre-stored CRC values 402. The CRC of the message is generally a superposition of all CRC values 402 stored in table rows 401 and tagged by a "1" bit 403. In other words, any row 401 tagged with a "1" bit 403 is subject to an XOR operation. As a specific example, suppose a message block $\vec{b}$=110111100111010, $\vec{p}$=1010 and W=3. Using lookup table 400 in FIG. 4, rows 401 tagged by the "1" bits 403 are summed together as shown in Equation 11. Equation 11 yields the same CRC message ($\vec{m}$), CRC($\vec{m}$)=100, as found in Equation 8.

$$CRC(\vec{m})=10\oplus10\oplus100\oplus10\oplus100\oplus10\oplus100\oplus$$
$$10\oplus100\oplus100\oplus10 \qquad \text{[Eqn 11]}$$

Accordingly, the CRC of a large message may be found using Equation 3 by using a lookup table, performing multiplying-accumulating modulo-2 (i.e., over GF(2)) with pre-stored coefficients ($\vec{\beta}_i$) and finally dividing the accumulator by the CRC polynomial. The division by the CRC polynomial may be accomplished nibble-wise via a lookup table of 16×W bits. Thus, according to one embodiment of the present disclosure, CRC calculations may be accomplished with a first lookup table having M×W bits and a second lookup table having 16×W bits for the final CRC calculations. Each lookup table is preferably fully reconfigurable. It should be understood that any suitable lookup table may be used in accordance with the present disclosure.

In one embodiment, there is no upper limit on the throughput (i.e., the number of XOR calculations performed in parallel. The estimated cycle count for calculating the CRC of a message of size N is given by Equation 12, where K is the number of XOR calculation performed.

$$\frac{N}{M}(\log_K(M)+1) + \left\lfloor\frac{2W-1}{4}\right\rfloor \propto \frac{N}{M}\log_K(M) \qquad \text{[Eqn. 12]}$$

If full pipelining is assumed, the term ($\log_K(M)$+1) may be eliminated from Equation 12. Thus, the CRC of a message block may be calculated within a single clock cycle. Moreover, a system in accordance with one embodiment of the present disclosure does not require specialized hardware, such as Galois multipliers. In the specific case of larger message blocks, existing multiplier may be used in accordance with the present disclosure for the modulo-2 multiply-accumulate operations if the carry-bit capability is turned off.

Figure 5:
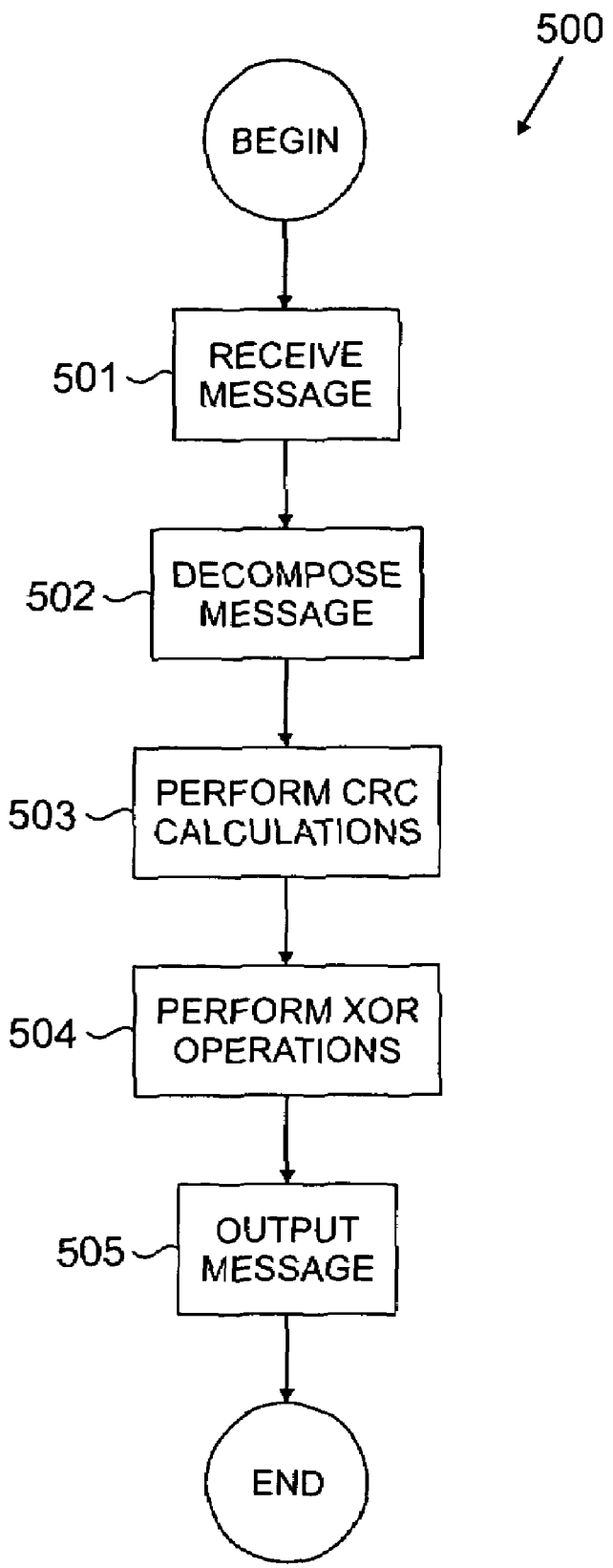
FIG. 5 is simplified flowchart illustrating a method in accordance with one embodiment of the present disclosure.

FIG. 5 is a simplified flowchart illustrating method 500 according to one embodiment of the present disclosure. Method 500 includes cyclic redundancy checks (CRC) for use in various digital signal processing systems. Method 500 begins with receiving a message ($\vec{m}$) in step 501 and decomposing that message ($\vec{m}$) into a series of smaller blocks ($\vec{b}_i$) in step 502. Each block ($\vec{b}_i$) is of size (M) and is related to a unit vector ($\vec{e}_i$). A summation operation on the blocks ($\vec{b}_i$) given by $$CRC(\vec{b}) = \sum b_i \cdot CRC(\vec{e}_i)$$

performed in step 503, where each CRC of the unit vectors (CRC($\vec{e}_i$)) is found using a lookup table, such as lookup table 400. The lookup table 400 is tagged by the "one" bits 402 of the message block. An exclusive OR (XOR) operation is performed on each tagged rows of lookup table 400 to calculate the CRC of the message in step 504. Finally, the CRC of the message is output in step 505.

It should be understood that embodiments of the present disclosure may be implemented into existing designs without requiring special hardware. Although certain aspects of the present disclosure have been described in relations to specific systems, standards and structures, it should be easily appreciated by one of skill in the art that the system of the present disclosure provides and comprehends a wide array of variations and combinations easily adapted to a number of signal processing systems. As described herein, the relative arrangement and operation of necessary functions may be provided in any manner suitable for a particular application. All such variations and modifications are hereby comprehended. It should also be appreciated that the constituent members or components of this system may be produced or provided using any suitable hardware, firmware, software, or combination(s) thereof.

The embodiments and examples set forth herein are therefore presented to best explain the present disclosure and its practical application, and to thereby enable those skilled in the art to make and utilize the system of the present disclosure. The description as set forth herein is therefore not intended to be exhaustive or to limit any invention to a precise form disclosed. As stated throughout, many modifications and variations are possible in light of the above teaching without departing from the spirit and scope of the following claims.

What is claimed is:

1. A method for cyclic redundancy checks (CRC) having a CRC polynomial of width (W), comprising:

receiving a message ($\vec{m}$);

decomposing the message ($\vec{m}$) into a series of smaller blocks ($\vec{b}_i$) of size (M) and unit vectors ($\vec{e}_i$); and performing a summation operation on the blocks ($\vec{b}_i$) given by $$CRC(\vec{b}) = \sum b_i \cdot CRC(\vec{e}_i),$$

wherein the CRC of the unit vectors (CRC($\vec{e}_i$)) is stored in a lookup table.

2. The method of claim 1 further comprising:
tagging the lookup table with bits of the blocks ($\vec{b}_i$).

3. The method of claim 2, wherein the bits are "one" bits.

4. The method of claim 2 further comprising:
performing an exclusive OR (XOR) operation on tagged rows of the lookup table.

5. The method of claim 4, wherein the XOR operation is conducted in parallel with another XOR operation.

6. The method of claim 4, wherein the XOR operation is conducted in a tree-wise fashion.

7. The method of claim 1, wherein the lookup table is M×W bits.

8. The method of claim 1 further comprising:
reconfiguring the CRC polynomial.

9. The method of claim 8, wherein the reconfiguring is accomplished by loading a new lookup table for the CRC of the unit vectors ($\vec{e}_i$).

10. A system for cyclic redundancy checks (CRC) having a CRC polynomial of width (W), comprising:
a controller capable of:

receiving a message ($\vec{m}$);

decomposing the message ($\vec{m}$) into a series of smaller blocks ($\vec{b}_i$) of size (M) and unit vectors ($\vec{e}_i$); and performing a summation operation on the blocks ($\vec{b}_i$) given by $$CRC(\vec{b}) = \sum b_i \cdot CRC(\vec{e}_i),$$

wherein the CRC of the unit vectors (CRC($\vec{e}_i$)) is stored in a lookup table.

11. The system of claim 10, wherein bits of the blocks ($\vec{b}_i$) are a tag for the lookup table.

12. The system of claim 11, wherein the bits are "one" bits.

13. The system of claim 11, wherein the tag indicates which rows of the lookup table require an exclusive OR (XOR) operation.

14. The system of claim 13, wherein the XOR operation is conducted in parallel with another XOR operation.

15. The system of claim 13, wherein the XOR operation is conducted in a tree-wise fashion.

16. The system of claim 10, wherein the lookup table is M×W bits.

17. The system of claim 10, wherein the CRC polynomial is reconfigured by loading a new lookup table for the CRC of the unit vectors ($\vec{e}_i$).

18. For use in a signal processing system, a process for cyclic redundancy checks (CRC), comprising:

decomposing a message ($\vec{m}$) into a series of smaller blocks ($\vec{b}_i$) of size (M) and unit vectors ($\vec{e}_i$); and performing a summation operation on the blocks ($\vec{b}_i$), wherein the operation is given by $$CRC(\vec{b}) = \sum b_i \cdot CRC(\vec{e}_i).$$

19. The process of claim 18 further comprising:
looking up values for the CRC of the unit vectors (CRC ($\vec{e}_i$)) in a lookup table.

20. The process of claim 18 further comprising:
tagging the lookup table with "one" bits of the blocks ($\vec{b}_i$).

21. The process of claim 20 further comprising:
performing an exclusive OR (XOR) operation on tagged rows of the lookup table.

22. The process of claim 21, wherein the XOR operation is conducted in parallel with another XOR operation.

23. The process of claim 21, wherein the XOR operation is conducted in a tree-wise fashion.

24. The process of claim 18, wherein the lookup table is M×W bits, wherein W is a width of a CRC polynomial.

25. The process of claim 18 further comprising:
reconfiguring the CRC polynomial by loading a new lookup table for the CRC of the unit vectors ($\vec{e}_i$).

* * * * *

UNITED STATES PATENT AND TRADEMARK OFFICE
CERTIFICATE OF CORRECTION

PATENT NO.       : 7,627,802 B2                                                         Page 1 of 1
APPLICATION NO. : 11/504158
DATED            : December 1, 2009
INVENTOR(S)      : Pisek et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 778 days.

Signed and Sealed this

Twenty-first Day of December, 2010

David J. Kappos
*Director of the United States Patent and Trademark Office*